United States Patent [19]

Petrov et al.

[11] 4,436,619
[45] Mar. 13, 1984

[54] METHOD OF SORTING SEMICONDUCTOR DEVICES AND APPARATUS FOR PERFORMING THIS METHOD

[76] Inventors: Lev N. Petrov, Leninsky prospekt, 153, kv. 35; Viktor A. Adoniev, ulitsa Starykh bolshevikov, 98, kv. 51; Valery I. Kononov, Leninsky prospekt, 151, kv. 18, all of Voronezh, U.S.S.R.

[21] Appl. No.: 291,956

[22] Filed: Aug. 11, 1981

[30] Foreign Application Priority Data

Jun. 6, 1978 [SU] U.S.S.R. ............................ 2639123
Aug. 28, 1980 [SU] U.S.S.R. ............................ 2980518

[51] Int. Cl.³ ........................................... B07C 5/344
[52] U.S. Cl. .................................. 209/573; 209/911; 209/921; 324/158 F
[58] Field of Search ............... 209/573, 574, 575, 921, 209/911; 221/189; 324/158 R, 158 D, 158 T, 158 F, 158 SC, 158 P

[56] References Cited

U.S. PATENT DOCUMENTS 3,239,059  3/1966  Cole, Jr. et al. .................... 209/573
4,094,410  6/1978  Fegley et al. ...................... 209/573

FOREIGN PATENT DOCUMENTS 472486  9/1975  U.S.S.R.

OTHER PUBLICATIONS

Daymarc Condensed Bulletin type 1635 and 3235.

Primary Examiner—Robert B. Reeves
Assistant Examiner—Donald Hajec
Attorney, Agent, or Firm—Fleit, Jacobson, Cohn & Price

[57] ABSTRACT

The method of sorting semiconductor devices includes the steps of feeding semiconductor devices into a contact mechanism and simultaneously connecting the contact elements of the contact mechanism to the leads of one semiconductor device, measuring the parameters of this semiconductor device while disconnecting the contact elements of the contact mechanism from the leads of another semiconductor device and delivering the latter. The apparatus for sorting semiconductor devices includes a device for loading the semiconductor devices, a contact mechanism underlying the loading device, coupled to the unit for measuring the electric parameters of the semiconductor devices and comprising contact elements mounted for timed motion, a conveying mechanism underlying the contact mechanism, the latter being associated with a drive and having two slots.

3 Claims, 3 Drawing Figures

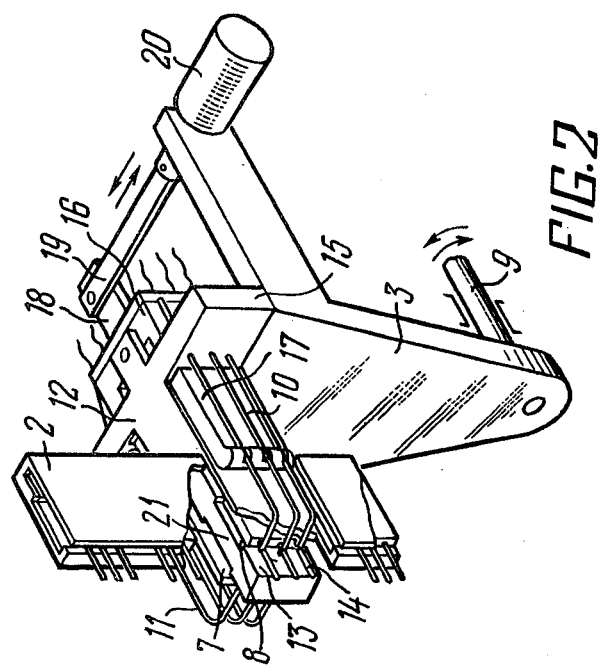
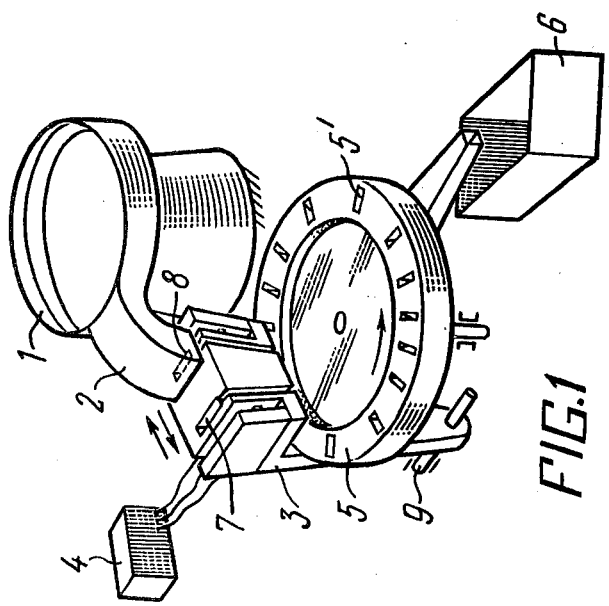

METHOD OF SORTING SEMICONDUCTOR DEVICES AND APPARATUS FOR PERFORMING THIS METHOD

FIELD OF THE INVENTION

The invention relates to the technology of manufacturing semiconductor devices, and more particularly it relates to methods of sorting semiconductor devices and to apparatus capable of performing such methods.

The invention can be utilized in electronics component industry and other industries for selective sorting and classification of articles in accordance with their linear dimensions, weight, magnetic properties, transparence, emissivity.

The disclosed method of sorting semiconductor devices and apparatus for performing this method are particularly intended for the electronics industry, e.g. for sorting semiconductor devices in plastic cases or enclosures, Types TO-220 and TO-116, into groups in accordance with their tested electric parameters or ratings.

BACKGROUND OF THE INVENTION

There is known a method of sorting semiconductor devices according to their electric parameters (cf. SU Inventor's Certificate No. 472,486; Int.Cl.$_2$ H 05 13/02, published in 1975), including the steps of feeding semiconductor devices into a contact mechanism, connecting the contact elements of the contact mechanism to the leads of the semiconductor device, measuring the electric parameters of the semiconductor device, disconnecting the contact elements from the leads of the semiconductor device and delivering the semiconductor device.

In this sorting method the steps or operations are carried out in succession, one by one, without superimposing them in time. The fact reduces the throughput attainable with this known method of sorting semiconductor devices.

The closest prior art of the present invention is the method of sorting semiconductor devices realized in the transistor sorters manufactured by Daymarc Corporation, the USA, Types 1635 and 3235 (cf. Quotation by Digital Processing Corporation, dated May 15, 1977, enclosing the condensed bulletins of Transistor Sorters, Types 1635 and 3235, manufactured by Daymarc Corporation), the method likewise including the steps of feeding semiconductor devices into the probe or contact mechanism, connecting the contact elements of the contact mechanism to the leads of the semiconductor device, measuring the electric parameters of the semiconductor device, disconnecting the contact elements from the leads of the semiconductor device and delivering the semiconductor devices.

The throughput attainable with this method is higher than that attainable with the previously described one, because in the last-mentioned method the steps or operations of feeding the semiconductor devices into the contact mechanism and delivering the semiconductor devices are superimposed in time. However, the throughput attainable with this method is limited by the fact that the majority of its steps or operations are not superimposed in time.

There is known an apparatus for testing and sorting electronic components (cf. the abovecited SU Inventor's Certificate No. 472,786; Int.Cl.$^2$ H 05 K 13/02, published 1975), comprising a conveying rotor with sockets adapted to accommodate the electronic components, a lever mounted for rotary motion coaxially with the rotor, having contact elements on its one arm and followers on its other arm, adapted to engage a cam, and a measuring unit. With the rotor moving, the contact elements connect the electronic components carried in the sockets of the rotor successively to the measuring unit. Upon the completion of the measurement or testing of the component in one socket, the contact elements return toward the successive socket, while the already tested component is directed into the sorting unit. However, this structure would not provide for superimposing the operations in time, since the time required for the return of the contact elements to the successive socket is not superimposed on the time required for carrying out other operations. This fact curbs down the throughput of the apparatus.

There is known an apparatus for performing the method embodied in Sorters, Types 1635 and 3235 manufactured by Daymarc Corporation, the USA, Comprising means for loading semiconductor devices, a contact mechanism or probe with contact elements, electrically connected with a unit for measuring the electric parameters of the semiconductor devices, and a conveying mechanism for delivering the sorted out semiconductor devices into respective receptacles or bins.

However, the design of the said Sorters, Types 1635 and 3235 embodying the abovedescribed method is relatively complicated, and their throughput is limited.

SUMMARY OF THE INVENTION

It is an object of the present invention to provide a method of sorting semiconductor devices and an apparatus capable of performing this method, which should enable to step up the throughput of the process of sorting semiconductor devices.

It is another object of the present invention to provide a method of sorting semiconductor devices and an apparatus for performing this method, which should enable to simplify the construction of the apparatus and to enhance the performance reliability thereof.

With these and other objects in view, the essence of the present invention resides in a method of sorting semiconductor devices, including feeding semiconductor devices in succession to a contact mechanism, connecting the contact elements of the contact mechanism to the leads of a semiconductor device, measuring the electric parameters of the semiconductor device, disconnecting the contact elements of the contact mechanism from the leads of the semiconductor device and delivering the semiconductor devices, in which method, in accordance with the invention, the connection of the contact elements of the contact mechanism to the leads of one semiconductor device is performed simultaneously with the disconnection of the contact elements of the contact mechanism from another semiconductor device and the delivering of the latter.

It is expedient that the connection of the contact elements of the contact mechanism to one semiconductor device and the disconnection of the contact elements of the contact mechanism from the leads of the other semiconductor device should be timed with the alteration of the direction of the relative movement of the contact mechanism and the outlet portion of the loading means.

It is further expedient that the measurement of the electric parameters of the semiconductor devices be performed in the course of the relative travel of the contact mechanism and the outlet portion of the loading means.

The essence of the invention further resides in an apparatus, comprising means for loading semiconductor devices, a contact mechanism with contact elements, arranged adjacent to the loading means to underlie the outlet portion thereof and electrically connected with a unit for measuring the electric parameters of the semiconductor devices, a conveying mechanism for delivering the sorted semiconductor devices into receptacles, underlying the contact mechanism, in which apparatus, in accordance with the invention, the contact mechanism has two slots adapted to accommodate the semiconductor devices and is operatively connected with a drive for reciprocation relative to the outlet portion of the loading means, the contact elements of the contact mechanism being mounted for simultaneous travel.

It is expedient that the surface between the slots of the contact mechanism be a land situated lower than the end face of the outlet portion of the loading means by an extent not in excess of one half of the height of the body of the semiconductor device.

An essence of the invention still further resides also in an apparatus comprising means for loading semiconductor devices, having an outlet portion with receiving and delivering ends, a contact mechanism with contact elements, arranged adjacent to the loading means to underlie the outlet portion thereof and electrically connected with a unit for measuring the electric parameters of the semiconductor devices, a conveying mechanism for delivering the sorted semiconductor devices into receptacles, underlying the contact mechanism, in which apparatus, in accordance with the invention, the contact mechanism has two slots adapted to accommodate the semiconductor devices, the outlet portion of the loading means being mounted on a support adjoining the receiving end thereof and being operatively connected with a drive for its oscillation, the delivering end of the outlet portion of the loading means having an abutment arranged so that in the course of the motion of the outlet portion of the loading means, it alternatingly closes off the outlets of the slots of the contact mechanism.

The invention enables to cut down the time of sorting a semiconductor device by 30 to 50 percent, to provide an apparatus which is simple in design and reliable in operation, to automatically control the sorting rate in dependence on the duration of measuring the parameters of a semiconductor device, to reduce the amount of metal in the structure of the apparatus and to significantly facilitate its manufacture.

SUMMARY OF THE DRAWINGS

The invention will be further described in connection with embodiments thereof, illustrating the performability oo the disclosed method, with reference being made to the accompanying drawings, wherein:

FIG. 1 is a schematic perspective view of an apparatus for sorting semiconductor devices, embodying the invention;

FIG. 2 illustrates in more detail the contact mechanism is accordance with the invention;

DETAIL DESCRIPTION OF THE INVENTION

Figure 3:
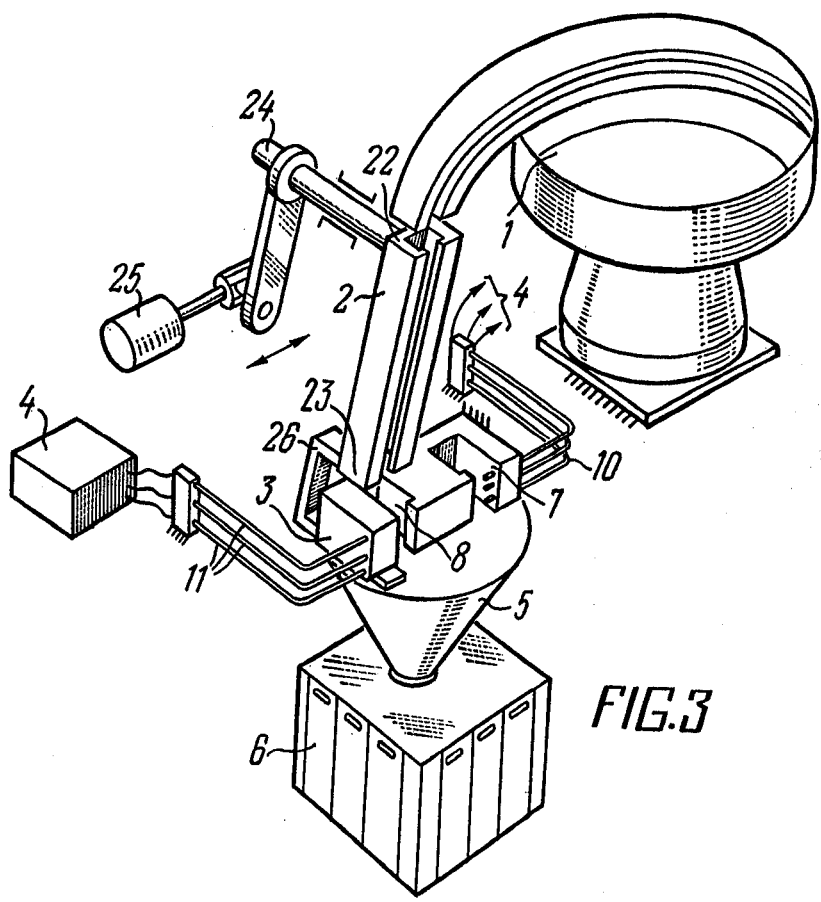
FIG. 3 is a schematic perspective view of a modified embodiment of the apparatus for sorting semiconductor devices, according to the invention.

Refering now in particular to the appended drawings, the apparatus includes a means or unit 1 (FIG. 1) for loading semiconductor devices, having an outlet portion 2, and a contact mechanism 3 adjoining the loading unit 1 and underlying the outlet portion 2 thereof, electrically connected with a unit 4 for measuring or testing the electric parameters of the semiconductor devices. The apparatus further comprises a conveying mechanism 5 with sockets 5' for carrying the sorted out semiconductor devices into respective receptacles 6, underlying the contact mechanism 3. The contact mechanism 3 has slots 7 and 8 adapted to accommodate the semiconductor devices and is associated with a drive 9 for its reciprocation relative to the loading unit 1. The contact mechanism 3 has contact elements 10 and 11 (FIG. 2) adjoining its respective slots 7 and 8. The contact elements 10 and 11 are mounted in the housing 12 for their simultaneous motion, for alternate contacting the semiconductor devices. The front portions of the lateral surfaces of the housing 12 define support areas or lands for the leads 14 of the semiconductor devices being tested. The contact elements 10 and 11 are arranged symmetrically with respect to the housing 12 and are supported by an upright 15 of the housing 12 of the contact mechanism 3. The upright 15 further supports a movable bifurcated member 16 of which the longitudinal prongs or arms 17 have their respective ends adapted to engage the contact elements 10 and 11. The bifurcated member 16 is operatively connected through an arm 18 and a strip 19 to its actuating drive 20. Alternatively, the contact elements 10 and 11 may be mounted independently of the contact mechanism 3 and associated with their own drive.

The surface between the slots 7 and 8 of the contact mechanism 3 defines a land 21 underlying the end face of the outlet portion 2 of the loading unit 1, with a vertical spacing therebetween not in excess of one half of the height of the case or enclosure of the semiconductor device.

In a modified embodiment of an apparatus capable of performing the method in accordance with the present invention, the loading means or unit 1 (FIG. 3) has its outlet portion 2 having a receiving end 22 and a delivering end 23, the apparatus further comprising a stationary contact mechanism 3 with two slots 7 and 8 having their respective inlets and outlets for the semiconductor devices and contact elements 10 and 11, and a conveying mechanism 5 for distributing the sorted semiconductor devices into respective groups. The contact mechanism 3 is likewise electrically connected with a unit 4 for measuring or testing the electric parameters of the semiconductor devices.

The outlet portion 2 of the loading unit 1 is mounted on a supporting member 24 adjoining its receiving end 22 and is operatively connected with a drive 25 for its oscillation, for rocking reciprocation of the delivering end 23. Thus, under the action of the drive 25, the delivering end 23 of the outlet portion 2 of the loading unit 1 is reciprocable between two extreme positions corresponding to the alternating alignment of this delivering end 23 with the slots 7 and 8 of the contact mechanism 3. The delivering end 23 of the outlet portion 2 carries a bail-shaped abutment 26.

The apparatus operates, as follows.

From the outlet portion 2 of the loading or feeding unit 1 (FIG. 1) a semiconductor device is fed into the slot 8 of the contact mechanism 3 (the first position). Here and hereinbelow we shall use the expression "the first position" to indicate the position of the contact mechanism 3 where the slot 8 is aligned with the outlet portion 2 of the loading unit 1, whereas "the second position" is that where it is the slot 7 which is aligned with the outlet portion 2 of the loading unit 1.

In this way there is performed the operation of feeding the semiconductor device into the contact mechanism 3. The slot 8 is now aligned with the outlet portion 2 of the loading unit 1 and with one of the sockets 5' of the conveying mechanism 5. With the semiconductor device fed into the slot 8 of the contact mechanism 3, the drive 20 (FIG. 2) is actuated to move the prongs 17 of the bifurcated member 16 into their extreme (leftmost) position where they release the contact elements 10 so that the latters' resilience bring them into engagement with the leads 14 of the semiconductor device in the slot 8, in which way the operation of the connection of the contact elements 10 of the contact mechanism 3 is performed. Now the unit 4 (FIG. 1) measures the electric parameters of the semiconductor device, while the contact mechanism 3 is moved by its correspondingly actuated drive 9 (FIG. 2) into the other extreme position of its reciprocation where the slot 7 aligns with the outlet portion 2 of the loading unit 1 (FIG. 1)—the second position; thus, the measurement or testing of the electric parameters of the semiconductor device is carried out while the contact mechanism 3 is moving.

While the mechanism 3 is thus moving, the lowermost semiconductor device in the outlet portion 2 of the loading unit 1 slides along the surface 21 (FIG. 2) of the contact mechanism 3, and, as soon as the slot 7 aligns fully with the outlet portion 2 of the loading unit 1, this semiconductor device falls into the slot 7.

Simultaneously with the connection of the contact elements 10 to the leads 14 of the semiconductor device in the slot 8, the contact elements 11 are disengaged from the leads 14 of the semiconductor device in the slot 7 by the same abovedescribed motion of the prongs 17 of the bifurcated member 16, in which way the operations of the disconnection and releasing or delivering of the semiconductor device from the slot 7 are performed; thus, the connection of the contact elements to the leads of one semiconductor device is effected simultaneously with the disconnection of the contact elements from the leads of another semiconductor device and releasing and delivering the latter; the connection of the contact elements to the leads of one semiconductor device and the disconnection of the contact elements from the leads of another semiconductor device being timed with the alteration or reversing of the motion of the contact mechanism 3.

With the contact mechanism 3 in the second position, a successive semiconductor device is fed, as it has been described, into the slot 7, and the drive 20 of the bifurcated member 16 is actuated to drive the prongs 17 of the latter into the other extreme (rightmost) position, whereby the contact elements 10 are moved out of the engagement with the leads 14 of the semiconductor device in the slot 8, while the resilience of the released contact elements 11 bring them into engagement with the leads 14 of the other semiconductor device in the slot 7. The semiconductor device in the slot 8 is now delivered into the respective one of the sockets 5' (FIG. 1) of the conveying mechanism 5, to be carried into the receptacle 6 of the corresponding group. As the contact mechanism 3 moves, its surface or land 21 (FIG. 2) between the slots 7, 8 closes off the outlet portion 2 of the loading unit 1, acting as the retainer of the semiconductor devices therein and enabling the unloading of the successive semiconductor device therefrom only when the contact mechanism 3 reaches one of its extreme positions whereat either its slot 7 or its slot 8 aligns with the outlet portion 2 of the loading unit 1. The outlet portion 2 of the loading unit 1 is so vertically spaced from the surface 21 of the contact mechanism 3, that it provides for complete unloading of the successive semiconductor device from the loading unit 1, while preventing partial unloading of the next-in-succession device into either the slot 7 or slot 8. To permit for the manufacturing tolerance of the linear dimensions of the case of the semiconductor devices, the outlet portion 2 of the loading unit 1 is vertically spaced from the surface 21 of the contact mechanism 3 by not more than one half of the height of the case of the semiconductor device. The spacing of about 1.5 to 2.0 mm is preferred.

The operation of the apparatus of the modification illustrated in FIG. 3 is carried out, as follows.

Semiconductor devices proceed from the loading unit 1 (FIG. 3) into its outlet portion 2, wherefrom they are fed in succession alternatingly into the slots 7 and 8 of the contact mechanism 3. This is done by actuating the drive 25 to align the unloading or delivering end 23 of the outlet portion 2 of the loading unit with one of the slots of the contact mechanism 3, e.g. with the slot 8. As this alignment occurs, the abutment 26 closes off the outlet of the contact mechanism 3, i.e. of its respective slot 8, so that the downmost semiconductor device falls from the outlet portion 2 onto the abutment 26 and is thus retained in the slot 8 of the contact mechanism 3. Now the contact elements 11 are made to engage the leads of the semiconductor device in the slot 8 and to retain the device during the measurement of its electric parameters. As the connection to the semiconductor device in the slot 8 is thus effected, the drive 25 of the outlet portion 2 of the loading unit 1 is actuated to move is delivering end 23 into alignment with the other slot 7 of the contact mechanism 3. Thus, several operations are effected all but simultaneously, viz. the connection of the contact elements 11 in the slot 8 to the leads of the semiconductor device therein, the disconnection of the contact elements 10 from the leads of the semiconductor device in the slot 7 and the delivering of this device, and the alignment of the delivering end 23 of the outlet portion 2 of the loading unit 1 with the slot 7 of the contact mechanism, to feed or unload the successive semiconductor device into the slot 7.

With the alignement attained, the contact elements 11 are made to disengage and release the leads of the semiconductor device in the slot 8, so that the device is unloaded into the conveying mechanism 5 distributing the semiconductor devices among the groups by their parameters, while the contact elements 10 are made to engage the leads of the semiconductor device in the slot 7. Then the abovedescribed cycle is repeated.

Thus, the disclosed apparatus is practically devoid of idle strokes, while the idling time of the unit for measuring the electric parameters of the semiconductor devices is defined solely by the period of the actuation of the contact elements, which enables to perform the operation of connecting one semiconductor device to the contact elements of the contact mechanism simultaneously with the disconnection from the contact elements of the contact mechanism of another semiconductor device and the unloading or delivering of the latter.

The implementation of the herein disclosed method of sorting semiconductor devices and of the apparatus performing this method has enabled to reduce the time of effecting the whole set of operations with the tested device to about one third, owing to the superimposition or overlapping in time of the operations of connecting one semiconductor device and disconnecting and delivering another one, as well as of the operations of loading or feeding one semiconductor device and measuring the electric parameters of another semiconductor device. The disclosed apparatus offers a significantly simplified design, with the reduction of the moving masses, so that greater operating speeds can be attained; the manufacture of the apparatus has been likewise substantially simplified, the amount of metal therein has been reduced, the performance reliability and maintenance have been enhanced, in comparison with the prior art. Furthermore, the disclosed apparatus enables, upon receiving a command from an external measurement control, to commence a new cycle with any test measurement included into the semiconductor device testing routine, i.e. the kinematic cycle of the apparatus is not bound by any rigid programs of its performance, being dependent as it is, mainly, on the duration of the sufficient number of tests for the identification of the class of the device to be tested.

What is claimed is:

1. An apparatus for sorting semiconductor devices, comprising:
   means for loading semiconductor devices having an outlet portion with a receiving end and a delivery end;
   a contact mechanism adjoining said loading means, underlying said outlet portion, and having two slots for receiving semiconductor devices from said delivery end of said outlet portion, each of said slots having a outlet;
   means for oscillating said outlet portion so that the delivery end is moved between a first limit position aligned with one of said slots and a second limit position aligned with a second of said slots;
   abutment means carried by said delivery end of said outlet portion of said loading means for alternatingly closing said outlets of said slots during movement of said outlet portion of said loading means;
   said contact mechanism having contact elements associated with each of said slots;
   means for moving said contact elements into and out of engagement with leads of semiconductor devices loaded into said slots;
   means for measuring the electric parameters of semiconductor devices electrically connected to said contact elements of said contact mechanism;
   receptacles for receiving semiconductor devices; and
   conveying means underlying said contact mechanism for receiving semiconductor devices from said slots and for sorting out semiconductor devices into respective ones of said receptacles.

2. An apparatus as set forth in claim 1, wherein a surface between said slots of said contact mechanism defines a land underlying said end face of said outlet portion of said loading means by an extent not in excess of one half of the height of the case of a semiconductor device to be sorted.

3. A method of sorting semiconductor devices using a contact mechanism having a plurality of slots with groups of contact elements associated with each of the slots, said method of sorting semiconductor devices including:
   feeding semiconductor devices by a loading means, said loading means having an outlet portion with a receiving end and a delivery end;
   receiving through two slots of a contact mechanism underlying said outlet portion, semiconductor devices from said delivery end of said outlet portion, each of said slots having an outlet;
   oscillating said outlet portion of said loading means so that the delivery end is moved between a first limit position aligned with one of said slots and a second limit position aligned with a second of said slots;
   alternatingly closing, by abutment means carried at said delivery end of said outlet portion of said loading means, said outlets of said slots during movement of said outlet portion of said loading means, said contact mechanism having contact elements associated with each of said slots;
   moving said contact elements into and out of engagement with leads of semiconductor devices fed into said slots;
   connecting said contact element of said contact mechanism to said leads of a first semiconductor device, performed simultaneously with the disconnection of said contact elements of said contact mechanism from a second semiconductor device;
   measuring electric parameters of semiconductor devices electrically connected to said contact elements;
   receiving semiconductor devices from said slots; and
   sorting out semiconductor devices into respective receptacles according to said measured electric parameters.

* * * * *

UNITED STATES PATENT AND TRADEMARK OFFICE
CERTIFICATE OF CORRECTION

PATENT NO. : 4,436,619

DATED : Mar. 13, 1984

INVENTOR(S) : Lev N. PETROV et al

It is certified that error appears in the above-identified patent and that said Letters Patent is hereby corrected as shown below:

On the title page after "[30] Foreign Application Priority Data" delete --June 6, 1978 [SU] U.S.S.R. ...........2639123--

Signed and Sealed this

Twentieth Day of November 1984

[SEAL]

Attest:

GERALD J. MOSSINGHOFF

Attesting Officer     Commissioner of Patents and Trademarks